Dec. 20, 1966 J. L. BOYER 3,293,508

COMPRESSION CONNECTED SEMICONDUCTOR DEVICE

Filed April 21, 1964

INVENTOR.
JOHN L. BOYER

BY

OSTROLENK, FABER, GERB & SOFFEN
ATTORNEYS

United States Patent Office 3,293,508
Patented Dec. 20, 1966

3,293,508

COMPRESSION CONNECTED SEMICONDUCTOR DEVICE

John L. Boyer, El Segundo, Calif., assignor to International Rectifier Corporation, El Segundo, Calif., a corporation of California Filed Apr. 21, 1964, Ser. No. 361,400
4 Claims. (Cl. 317—234)

This invention relates to a novel mounting structure for semiconductor wafers, and more specifically relates to a novel compression connection arrangement for connecting a semiconductor wafer to its various electrodes through a compression bonded joint.

At the present time, and in order to increase the current rating of a semiconductor device such as a diode, the common practice is to make the wafer area larger. This wafer is generally connected to some suitable electrode structure by soldering, whereby it is necessary that the electrode structure have the same thermal expansion characteristics as the diode.

While many electrode materials closely match the expansion characteristics, for example, of silicon which is commonly used for the wafer, there is still necessarily a certain amount of differential expansion which occurs during thermal cycling. This, of course, can lead to fracture of the wafer since the two are initimately connected by soldering.

In accordance with the present invention, a novel connection is provided for connecting a wafer to its electrical terminals by means of a compression joint. Thus, there is no intimate bonding between the wafer and its electrodes, whereupon the two may slide with respect to one another when there is differential expansion between the two.

In particular, and in accordance with the present invention, the novel compression joint is formed between the wafer and its electrodes at pressures which may be of the order of 1,500 to 2,000 lbs. per square inch. Under this condition, the unsoldered joints will have low electrical and thermal resistance, as required for the device.

Moreover, and in accordance with the invention, the novel compression joint is achieved through the use of a bolt means, and is independent of springs for supplying the compression pressure. Moreover, the adjacent main buses which are clamped to one another are provided with opposing elongated fins which permit extremely efficient cooling of the device.

Accordingly, a primary object of this invention is to provide a novel structure for high power semiconductor devices.

Another object of this invention is to provide a novel compression connection between a semiconductor device and its support structure.

Yet another object of this invention is to provide a novel compression bonded joint for semiconductor devices which does not require springs.

A still further object of this invention is to provide a novel bolt arrangement for a subassembly structure adapted for connection in a pressure connected assembly.

These and other objects of this invention will become apparent from the following description when taken in connection with the drawings, in which.

Figures 1, 2:
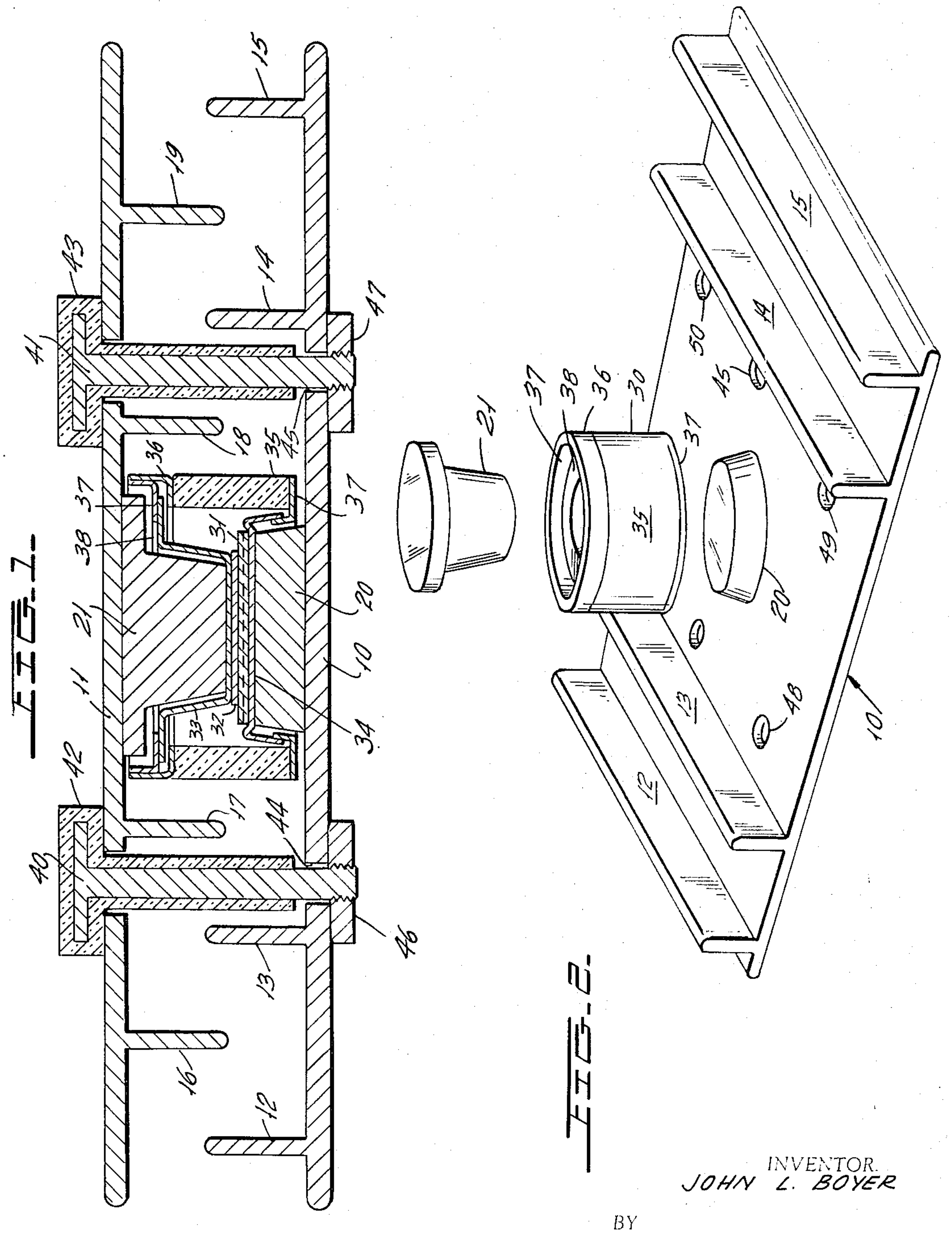
FIGURE 1 shows a cross-sectional view of the novel compression joint of the invention.
FIGURE 2 shows an exploded perspective view of the lower conductive support of FIGURE 1 along with the subassembled wafer structure.

Referring now to the figures, I have illustrated therein an electrical device which is comprised of a lower conductive support plate 10 and an upper conductive support plate 11. The plate 10 which is shown in FIGURE 2, as well as in FIGURE 1, is provided with elongated cooling fins 12, 13, 14 and 15, and may be extruded in shape and cut off to any particular desired length. In a similar manner, the upper plate 11 has extending cooling fins 16, 17, 18 and 19 which are staggered with respect to fins 12 through 15, as shown in FIGURE 1. Clearly, plate 11 and its respective cooling fins may also be of extruded stock. Note that this novel arrangement of opposing cooling fins forms a channel which can carry the flow of a suitable coolant such as air under pressure with a maximum area being in contact with the cooling area.

A conductive block 20 is then secured to plate 10 as by brazing, while a conductive block 21, which is shown in FIGURE 2 as well as FIGURE 1, is suitably secured to plate 11 in a position aligned with block 20. The blocks 20 and 21 then serve to receive a subassembly 30 which includes the semiconductor wafer 31. The semiconductor wafer 31 may have a junction therein, as indicated by dotted lines in FIGURE 1, or may have any desired number of junctions, depending upon the type device to be formed. In the embodiment of FIGURE 1, wafer 31 has a single junction therein for use as a diode.

The wafer 31 is then captured between a soft silver plate 32 which is immediately below conductive header 33. The bottom of wafer 31 is then received by the bottom silver header 34.

A ceramic spacing cylinder 35 is then provided with upper and lower conductive brazing rings 36 and 37, respectively, wherein upper brazing ring 36 is brazed to ring 37 which is, in turn, brazed to the upper header 38. Note that the upper header 38 is a dish-shaped member which extends downwardly and lies immediately atop soft silver wafer 32. The lower brazing ring 37 is then suitably secured to the lower header 34, as by brazing, whereupon a complete subassembly is formed for carrying the wafer 31.

In order to assemble the device, it will be apparent that the subassembly 35 is captured between conductive blocks 20 and 21, respectively, and a plurality of insulated bolts are then used to clamp plates 10 and 11 toward one another. By way of example, FIGURE 1 illustrates two bolts 40 and 41 which are each covered for a portion of their length including their heads with insulation sheaths 42 and 43, respectively. This insulation sheath is needed to insulate bolts 40 and 41 from plate 11.

The opposite ends of the bolts 40 and 41 then pass through openings such as openings 44 and 45 in plate 10, and are captured by suitable nuts 46 and 47, respectively. Clearly, any number of bolts may be used with FIGURE 2 illustrating additional through-openings 48, 49 and 50 which may receive additional securing bolts.

The bolts are then secured so that some desired and predetermined compression force is applied between blocks 20 and 21, whereupon a low electrical and thermal resistance path is established from plate 10 through header 34, wafer 31, silver wafer 32, header 33, block 21 and plate 11. A suitable terminal structure may then be provided for each of plates 10 and 11 for making external electrical connections.

Although this invention has been described with respect to its preferred embodiments, it should be understood that many variations and modifications will now be obvious to those skilled in the art, and it is preferred, therefore, that the scope of the invention be limited not by the specific disclosure herein, but only by the appended claims.

The embodiments of the invention in which an exclusive privilege or property is claimed are defined as follows:

1. A semiconductor device comprising a subassembly support, a semiconductor wafer carried by said subassembly support, and compression structure for applying compression forces to opposing surfaces of said subassembly support; said subassembly support comprising a first dish-shaped conductive header, a second dish-shaped conductive header, and a cylindrical insulator; said first and second dish-shaped conductive headers having flat bottom sections secured to axially extending peripheral sections; each of said axially extending peripheral sections extending away from one another and terminating in respective flanges; said cylindrical insulator extending between said respective flanges and being secured to said flanges at the respective opposite ends of said cylindrical insulator; said flat bottom sections being adjacent one another; said wafer being interposed between said flat bottom sections; said compression structure being connected to said flat bottom sections and biasing said flat bottom sections toward one another and into high pressure engagement with the respective opposite surfaces of said wafer; said compression structure including a first and second conductive plate positioned adjacent said flanges of said first and second headers, respectively, and a clamping means for clamping said first and second conductive plates toward one another; each of said first and second conductive plates having extending conductive portions for mechanically engaging said flat bottom sections of said first and second header, respectively.

2. The device substantially as set forth in claim 1 wherein said clamping means includes bolt means electrically insulated from said second conductive plate.

3. The device substantially as set forth in claim 1 wherein each of said first and second conductive plates have extending cooling fin sections extending toward one another and being laterally displaced from one another.

4. The device as set forth in claim 1 wherein said flat bottom sections of said first and second dish-shaped conductive headers are circular; the diameter of said first bottom section being greater than the diameter of said second bottom section.

References Cited by the Examiner

UNITED STATES PATENTS

| | | | |
|---|---|---|---|
| 2,815,472 | 12/1957 | Jackson et al. | 317—234 |
| 3,155,885 | 11/1964 | Marino et al. | 317—234 |
| 3,170,098 | 2/1965 | Marino | 317—234 |
| 3,192,454 | 6/1965 | Rosenheinrich et al. | 317—234 |
| 3,238,425 | 3/1966 | Geyer | 317—234 |

JOHN W. HUCKERT, *Primary Examiner.*

R. F. POLISSACK, *Assistant Examiner.*